(12) United States Patent
Tahara et al.

(10) Patent No.: US 8,349,085 B2
(45) Date of Patent: Jan. 8, 2013

(54) SUBSTRATE PROCESSING APPARATUS

(75) Inventors: Shigeru Tahara, Nirasaki (JP); Seiichi Takayama, Shanghai (CN); Morihiro Takanashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 287 days.

(21) Appl. No.: 12/023,327

(22) Filed: Jan. 31, 2008

(65) Prior Publication Data

US 2008/0179006 A1 Jul. 31, 2008

Related U.S. Application Data

(60) Provisional application No. 60/908,054, filed on Mar. 26, 2007.

(30) Foreign Application Priority Data

Jan. 31, 2007 (JP) ................................. 2007-022330

(51) Int. Cl.
*C23C 16/458* (2006.01)
*C23F 1/00* (2006.01)
*H01L 21/306* (2006.01)
*C23C 16/06* (2006.01)
*C23C 16/22* (2006.01)

(52) U.S. Cl. ... 118/719; 118/728; 118/729; 156/345.31; 156/345.32; 156/345.51; 156/345.54

(58) Field of Classification Search .................. 118/719, 118/728, 729; 156/345.31, 345.32, 345.51, 156/345.54

See application file for complete search history.

(56) References Cited

U.S. PATENT DOCUMENTS

| 3,915,117 | A | * | 10/1975 | Schertler | 118/719 |
| 3,954,191 | A | * | 5/1976 | Wittkower et al. | 414/217 |
| 4,857,142 | A | * | 8/1989 | Syverson | 216/79 |
| 5,002,010 | A | * | 3/1991 | Weinberg | 118/719 |
| 5,009,738 | A | * | 4/1991 | Gruenwald et al. | 156/345.47 |
| 5,169,408 | A | * | 12/1992 | Biggerstaff et al. | 29/25.01 |
| 5,223,001 | A | * | 6/1993 | Saeki | 29/25.01 |
| 5,314,574 | A | * | 5/1994 | Takahashi | 438/706 |
| 5,520,743 | A | * | 5/1996 | Takahashi | 118/730 |

(Continued)

FOREIGN PATENT DOCUMENTS

| CN | 1834791 A | 9/2006 |
| JP | 61-291965 | 12/1986 |

(Continued)

OTHER PUBLICATIONS

Office Action issued Aug. 22, 2011, in Japanese Patent Application No. 2007-022330 (with partial English-language translation).

*Primary Examiner* — Rudy Zervigon
(74) *Attorney, Agent, or Firm* — Oblon, Spivak, McClelland, Maier & Neustadt, L.L.P.

(57) ABSTRACT

A substarate processing apparatus capable of reducing the capacity of a space in an internal chamber. The internal chamber is housed in a space in an external chamber. A gas supply unit supplies a process gas into the space in the internal chamber. The space in the external chamber is under a reduced pressure or filled with an inert gas. An enclosure being movable and included in the internal chamber defines the space in the internal chamber with a stage heater included in the internal chamber. When a wafer is transferred in and out by a transfer arm used to transfer the wafer, the enclosure exits out of a motion range within which the transfer arm can move.

7 Claims, 4 Drawing Sheets

U.S. PATENT DOCUMENTS

| | | | | |
|---|---|---|---|---|
| 5,525,160 A * | 6/1996 | Tanaka et al. | | 118/728 |
| 5,769,952 A * | 6/1998 | Komino | | 118/733 |
| 5,778,968 A * | 7/1998 | Hendrickson et al. | | 165/80.1 |
| 5,820,329 A * | 10/1998 | Derbinski et al. | | 414/225.01 |
| 5,882,413 A * | 3/1999 | Beaulieu et al. | | 118/719 |
| 6,048,154 A * | 4/2000 | Wytman | | 414/217 |
| 6,074,538 A * | 6/2000 | Ohmi et al. | | 204/298.06 |
| 6,221,781 B1 * | 4/2001 | Siefering et al. | | 438/704 |
| 6,231,289 B1 * | 5/2001 | Theriault et al. | | 414/217 |
| 6,234,107 B1 * | 5/2001 | Tanaka et al. | | 118/723 R |
| 6,254,328 B1 * | 7/2001 | Wytman | | 414/217 |
| 6,338,626 B1 * | 1/2002 | Saeki | | 432/243 |
| 6,394,733 B1 * | 5/2002 | Toda et al. | | 414/221 |
| 6,409,837 B1 * | 6/2002 | Hillman | | 118/712 |
| 6,497,734 B1 * | 12/2002 | Barber et al. | | 29/25.01 |
| 6,514,869 B2 | 2/2003 | Wada et al. | | |
| 6,530,732 B1 * | 3/2003 | Theriault et al. | | 414/217 |
| 6,602,348 B1 * | 8/2003 | Rogelstad | | 118/719 |
| 6,617,095 B2 * | 9/2003 | Kitano et al. | | 430/313 |
| 6,620,251 B2 * | 9/2003 | Kitano | | 118/725 |
| 6,841,200 B2 * | 1/2005 | Kraus et al. | | 427/452 |
| 6,846,380 B2 * | 1/2005 | Dickinson et al. | | 156/345.31 |
| 6,875,281 B2 * | 4/2005 | Kitano et al. | | 118/719 |
| 7,008,879 B2 * | 3/2006 | Lee et al. | | 438/758 |
| 7,018,504 B1 * | 3/2006 | Raaijmakers et al. | | 156/345.31 |
| 7,066,703 B2 * | 6/2006 | Johnson | | 414/217 |
| 7,422,636 B2 * | 9/2008 | Ishizaka | | 118/719 |
| 7,682,454 B2 * | 3/2010 | Sneh | | 118/719 |
| 8,252,116 B2 * | 8/2012 | Sneh | | 118/715 |
| 2001/0021486 A1 * | 9/2001 | Kitano | | 430/322 |
| 2002/0034862 A1 | 3/2002 | Wada et al. | | |
| 2003/0019580 A1 * | 1/2003 | Strang | | 156/345.33 |
| 2004/0050496 A1 * | 3/2004 | Iwai et al. | | 156/345.51 |
| 2004/0140054 A1 * | 7/2004 | Johnson | | 156/345.43 |
| 2006/0150904 A1 * | 7/2006 | Ozaki et al. | | 118/715 |
| 2006/0213439 A1 * | 9/2006 | Ishizaka | | 118/715 |
| 2008/0179006 A1 * | 7/2008 | Tahara et al. | | 156/345.29 |

FOREIGN PATENT DOCUMENTS

| | | | |
|---|---|---|---|
| JP | 7-176493 | | 7/1995 |
| JP | 7-201752 | | 8/1995 |
| JP | 11040645 A | * | 2/1999 |
| JP | 2008192642 A | * | 8/2008 |
| KR | 2002-0022563 | | 3/2002 |
| KR | 10-2004-0048618 | | 6/2004 |

* cited by examiner

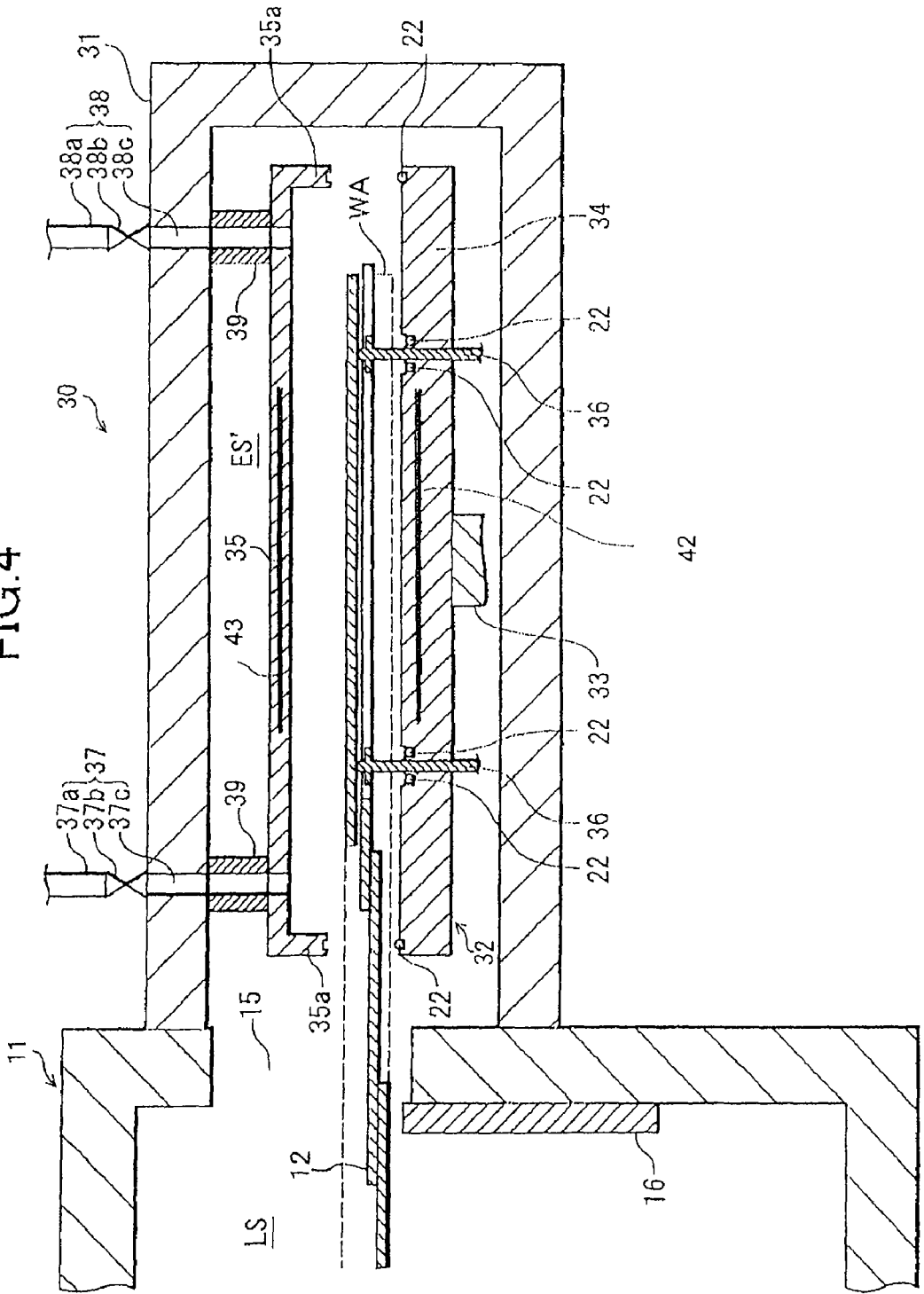

SUBSTRATE PROCESSING APPARATUS

BACKGROUND OF THE INVENTION

1. Field of the Invention

The present invention relates to substrate processing apparatuses, and in particular to a substrate processing apparatus having a dual-chamber structure including an external chamber and an internal chamber housed in the external chamber.

2. Description of the Related Art

In semiconductor manufacturing processes for manufacturing a semiconductor device from a wafer as a substrate, a process involving chemical reactions induced by process gases tends to be widely used. The process involving chemical reactions (hereinafter referred to as "chemical reaction process") corresponds to, for example, a process of restoring insulating films with a low dielectric constant (Low-k film) that are damaged during ashing to remove resist films by silylation gases.

In addition, vacuum processes, such as an etching process, an ashing process and a CVD process, have been frequently used in the conventional semiconductor manufacturing processes. After these vacuum processes, carrying the wafers subjected to the vacuum processes in the air can possibly produce various failures. Specifically, natural oxidation occurs on a metal layer formed through the CVD process to form an oxide film that causes conduction failures in a semiconductor device. Alternatively, the Low-k film absorbs moisture. The silylation gases (e.g., $Si(CH_3)_3$—$N(CH_3)_2$) react with a hydroxyl group (OH group) in the moisture to produce a side reaction product ($Si(CH_3)_3$—O—$Si(CH_3)_3$) that fills in trenches and via holes formed by etching.

It is therefore preferable for a wafer, especially for a wafer subjected to the vacuum process and subsequently requiring the chemical reaction process, to adopt a transfer method in which the wafer is carried in a vacuum or in an atmosphere of an inert gas, without being exposed to the air after the vacuum process, into a processing room (chamber) for carrying out the chemical reaction process to the wafer.

Conventionally, substrate processing apparatuses having a dual-chamber structure are known which include an external chamber whose inside is maintained under vacuum and an internal chamber housed in a space inside the external chamber (see, e.g., Japanese Laid-open Patent Publication (Kokai) No. 61-291965). This substrate processing apparatus maintains a vacuum in the space inside the external chamber, while introducing a process gas used for the chemical reaction process into a space inside the internal chamber, and further transfers the wafer subjected to the vacuum process through the space in the external chamber into the space in the internal chamber, thereby realizing the above-mentioned transfer method.

However, the silylation gas used as a process gas is costly, and therefore a reduction in usage of the silylation gas is required. In other words, what's required is to reduce the usage of the process gas as much as possible, and by extension to reduce the capacity of the space in the internal chamber into which the process gas is introduced.

On the other hand, the above-mentioned substrate processing apparatus having the dual-chamber structure is provided with a wafer loading/unloading port on a side wall of the internal chamber in order to transfer the wafer into the space in the internal chamber or a top lid capable of opening/closing an opening disposed on the upper part of the internal chamber. In order to transfer the wafer into such an internal chamber, an arm that transfers the wafer needs to go into the space in the internal chamber through the wafer loading/unloading port or the opening. Accordingly, there should be a clearance between the arm and components in the internal chamber to keep the arm from contact with the components, and consequently, the capacity of the space in the internal chamber cannot be reduced.

SUMMARY OF THE INVENTION

The present invention provides a substrate processing apparatus capable of reducing the capacity of the space in the internal chamber.

Accordingly, there is provided a substrate processing apparatus comprising an external chamber, an internal chamber housed in a space in the external chamber, and a gas supply unit adapted to supply a process gas into the space in the internal chamber, wherein the space in the external chamber is under a reduced pressure or filled with an inert gas, wherein the internal chamber includes a movable component defining the space in the internal chamber with at least one another component and being movable, and wherein when a substrate is transferred in and out by a transfer arm used to transfer the substrate, the movable component exits out of a motion range within which the transfer arm can move.

According to the present invention, when the substrate is transferred in and out by the transfer arm used to transfer the substrate, the movable component defining the space in the internal chamber exits out of the motion range of the transfer arm. Accordingly, there is no contact between the transfer arm and movable component and no need to secure a clearance for the arm and movable component in the internal chamber. As a result, the capacity of the space in the internal chamber can be reduced.

The present invention can provide a substrate processing apparatus, wherein the at least one another component is a mounting stage on which the substrate is mounted and the movable component is a lid-like member covering the mounting stage, and when the substrate is transferred in and out by the transfer arm, the lid-like member moves away from the mounting stage.

According to the present invention, when the substrate is transferred in and out by the transfer arm, the lid-like member as the movable component moves away from the mounting stage as the at least one another component. Since the moving mechanism of the lid-like member merely needs a relatively simple structure, the substrate processing apparatus can be structurally simple.

The present invention can provide a substrate processing apparatus, wherein the movable component is a mounting stage on which the substrate is mounted and the at least one another component is a lid-like member covering the mounting stage, and when the substrate is transferred in and out by the transfer arm, the mounting stage moves away from the lid-like member.

According to the present invention, when the substrate is transferred in and out by the transfer arm, the mounting stage as the movable component moves away from the lid-like member as the at least one another component. Reaction products may sometimes adhere to the lid-like member; however the lid-like member is immovable and the reaction products are thus not peeled off, unlike in the case where a movable lid-like member drops reaction products peeled off due to impact of the movement of the movable lid-like member, and therefore the immovable lid-like member can prevent foreign matter from adhering to the substrate mounted on the mounting stage.

The present invention can provide a substrate processing apparatus, wherein the movable component and the at least one another component each include a heating unit.

According to the present invention, the movable component and the at least one another component each include a heating unit. The restoration process for the low dielectric constant insulating film in the substrate is enhanced by heat. Therefore, the low dielectric constant insulating film can be promptly restored.

The present invention can provide a substrate processing apparatus, wherein the gas supply unit includes a gas supply pipe in communication with the space in the internal chamber, the gas supply pipe has an open/close valve opening and closing the gas supply pipe, and the open/close valve is disposed in the proximity of the internal chamber.

According to the present invention, the open/close valve of the gas supply pipe in communication with the space in the internal chamber is arranged in the proximity of the internal chamber. Closing of the open/close valve reduces the capacity of a part of the gas supply pipe in communication with the internal chamber, thereby reliably reducing the usage of the process gas.

The features and advantages of the invention will become more apparent from the following detailed description taken in conjunction with the accompanying drawings.

BRIEF DESCRIPTION OF THE DRAWINGS

FIG. 4 is a cross-sectional view showing the stage heater in FIG. 3 spaced apart from the enclosure.

DETAILED DESCRIPTION OF THE PREFERRED EMBODIMENTS

The present invention will now be described in detail with reference to the drawings showing preferred embodiments thereof.

First, a description will be given of a substrate processing apparatus according to the first embodiment of the present invention.

Figure 1:
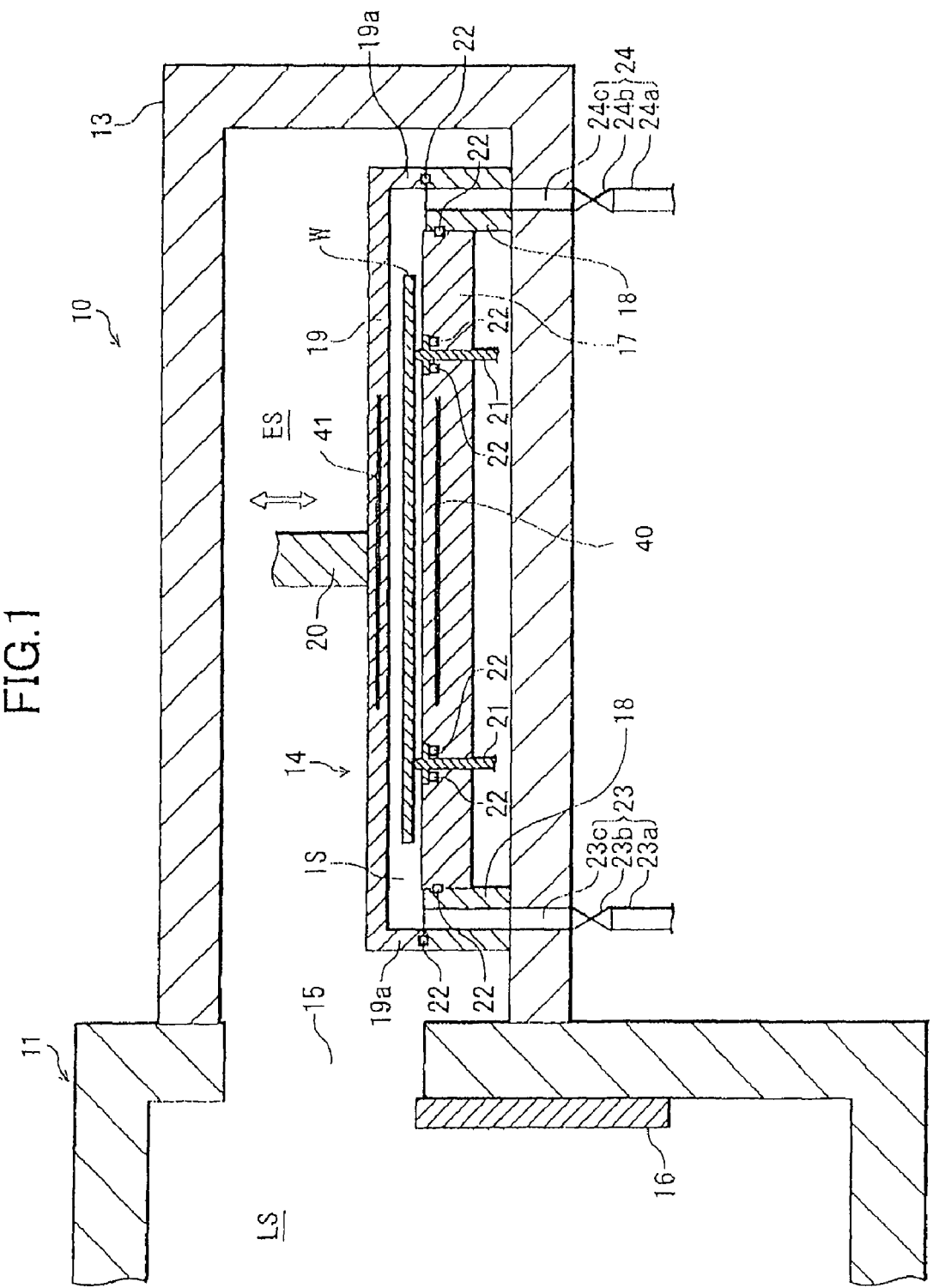
FIG. 1 is a cross-sectional view schematically showing the construction of a substrate processing apparatus according to a first embodiment of the present invention.

FIG. 1 is a cross-sectional view schematically showing the construction of the substrate processing apparatus according to the present embodiment.

In FIG. 1, the substrate processing apparatus 10 is disposed adjacent to a load lock chamber 11 as a transfer chamber used for transferring a semiconductor wafer (hereinafter simply referred to as "wafer") W. This load lock chamber 11 has a transfer arm 12, described later, on which the wafer W is mounted to transfer it, and a space LS therein maintained under vacuum.

The substrate processing apparatus 10 is comprised of a case-like external chamber 13 connected to the load lock chamber 11 and an internal chamber 14 housed in a space ES in the external chamber 13. The space ES in the external chamber 13 is depressurized by an exhaust device (not shown) to be maintained close to a vacuum. In addition, the external chamber 13 has a wafer loading/unloading port 15, on its side wall, to allow the space LS and space ES to communicate with each other. The wafer loading/unloading port 15 is opened/closed by a slide-valve type gate valve 16 provided in the load lock chamber 11.

The internal chamber 14 includes a stage heater 17 (at least one another component), which is a disc member disposed on the lower part of the space ES, containing a heater 40 (heating unit) and functioning as a mounting stage on which a wafer W is mounted, an enclosure base 18 (at least one another component), which is an annular ring member, disposed so as to stand on the bottom of the external chamber 13 and surround the periphery of the stage heater 17, and an enclosure 19 (movable component), which is a circular lid-like member, disposed so as to cover the stage heater 17 and enclosure base 18.

A plurality of pusher pins 21 are arranged on the stage heater 17 so as to freely project from the surface of the stage heater 17. In addition, the pusher pins 21 support the wafer W from the back surface. Even if the pusher pins 21 are at the lowermost position with respect to the stage heater 17, the pusher pins 21 somewhat project from the surface of the stage heater 17, and therefore the wafer W is spaced somewhat apart from the stage heater 17.

The enclosure 19 is connected to a moving mechanism (not shown) through a rod 20 and moves freely along the direction of the outlined arrow in FIG. 1. Since the moving mechanism herein just has to control the movement of the only enclosure 19, the moving mechanism can be realized with a relatively simple structure for enabling linear reciprocating motion. In addition, the enclosure 19 has a cylindrical-shaped side wall 19a that surrounds the outer edge of the enclosure 19 and juts toward the enclosure base 18. The enclosure 19 also contains a heater 41 (heating unit).

When the enclosure 19 abuts the enclosure base 18, the stage heater 17, enclosure base 18 and enclosure 19 define a space IS. O-rings 22 are arranged between the stage heater 17 and enclosure base 18, between the enclosure base 18 and side wall 19a of the enclosure 19, and between the stage heater 17 and pusher pin 21, respectively, to seal the space IS from the space ES. When the wafer W is housed in the space IS under this condition, the pusher pins 21 are at the lowermost position with respect to the stage heater 17, thereby reducing the height of the space IS and thus decreasing the capacity of the space IS.

The substrate processing apparatus 10 is comprised of a process-gas supply unit 23 supplying a process gas and nitrogen gas ($N_2$ gas) into the space IS and a process-gas exhaust unit 24 exhausting the process gas in the space IS.

The process-gas supply unit 23 includes a gas supply pipe 23a installed outside the external chamber 13, a supply-side open/close valve 23b which is attached to the gas supply pipe 23a and opens and closes the gas supply pipe 23a, and a gas supply hole 23c which penetrates a wall of the external chamber 13 and enclosure base 18 and has an opening facing the enclosure 19.

The space IS in communication with the gas supply hole 23c and gas supply pipe 23a is supplied with a process gas from an external gas supply apparatus (not shown) through the gas supply hole 23c, supply-side open/close valve 23b and gas supply pipe 23a. In the process-gas supply unit 23, the supply-side open/close valve 23b is disposed in the proximity of the internal chamber 14, more specifically adjacent to the external chamber 13. As the supply-side open/close valve 23b closes the gas supply pipe 23a, only the gas supply hole 23c communicates with the space IS.

The process-gas exhaust unit 24 includes a gas exhaust pipe 24a installed outside the external chamber 13, an exhaust-side open/close valve 24b which is attached to the gas exhaust pipe 24a and opens and closes the gas exhaust pipe 24a, and a gas exhaust hole 24c which penetrates a wall of the external chamber 13 and the enclosure base 18 and has an opening facing the enclosure 19.

The process gas in the space IS in communication with the gas exhaust hole 24c and gas exhaust pipe 24a is exhausted by an external exhaust apparatus (not shown) through the gas exhaust hole 24c, exhaust-side open/close valve 24b and gas exhaust pipe 24a. In the process-gas exhaust unit 24, the exhaust-side open/close valve 24b is disposed in the proximity of the internal chamber 14, more specifically adjacent to the external chamber 13. As the exhaust-side open/close valve 24b closes the gas exhaust pipe 24a, only the gas exhaust hole 24c communicates with the space IS.

By the way, the Low-k film generally has a structure with a methyl group, which is an organic element, at ends as shown in the following chemical formula (1).

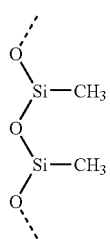
(1)

After the wafer W having this Low-k film and resist film undergoes the resist film removal processing by ashing or the like, the structure of the Low-k film changes to a structure as shown in the following chemical formula (2) (the Low-k film is damaged).

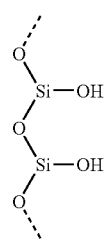
(2)

Since the structure shown in chemical formula (2) has a hydroxyl group at the ends but not organic element, the film having such a structure cannot function as a Low-k film. To prevent this, the above-mentioned silylation gas is used to substitute an organic element for the hydroxyl group at the end. Specifically, the film having the structure of the above chemical formula (2) is reacted with the silylation gas to obtain the structure shown in the chemical formula (3) below. In short, the Low-k film is restored by the silylation gas.

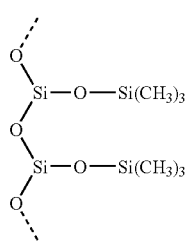
(3)

In a state where the enclosure 19 abuts the enclosure base 18 and the wafer W containing the damaged Low-k film is housed in the space IS, the silylation gas (e.g., $Si(CH_3)_3$-N$(CH_3)_2$) and nitrogen gas are supplied from the process-gas supply unit 23 to the space IS. After the space IS is filled with a certain amount of the silylation gas and nitrogen gas, the supply-side open/close valve 23b of the process-gas supply unit 23 closes the gas supply pipe 23a and the exhaust-side open/close valve 24b of the process-gas exhaust unit 24 closes the gas exhaust pipe 24a. This seals the space IS and maintains the space IS at a pressure of $1.3 \times 10^3$ Pa (10 Torr) to $6.67 \times 10^3$ Pa (50 Torr). Simultaneously, the silylation gas reacts with the damaged Low-k film having the structure shown in the above-mentioned chemical formula (2) in the space IS to restore the Low-k film. Since the reaction of the silylation gas and the damaged Low-k film is enhanced by heat, the heater in the enclosure 19 and the heater 40 in the stage heater 17 apply heat to the wafer W to enhance the restoration process of the Low-k film. After a certain time of sealing, the process-gas exhaust unit 24 discharges the silylation gas and so on in the space IS.

Figure 2:
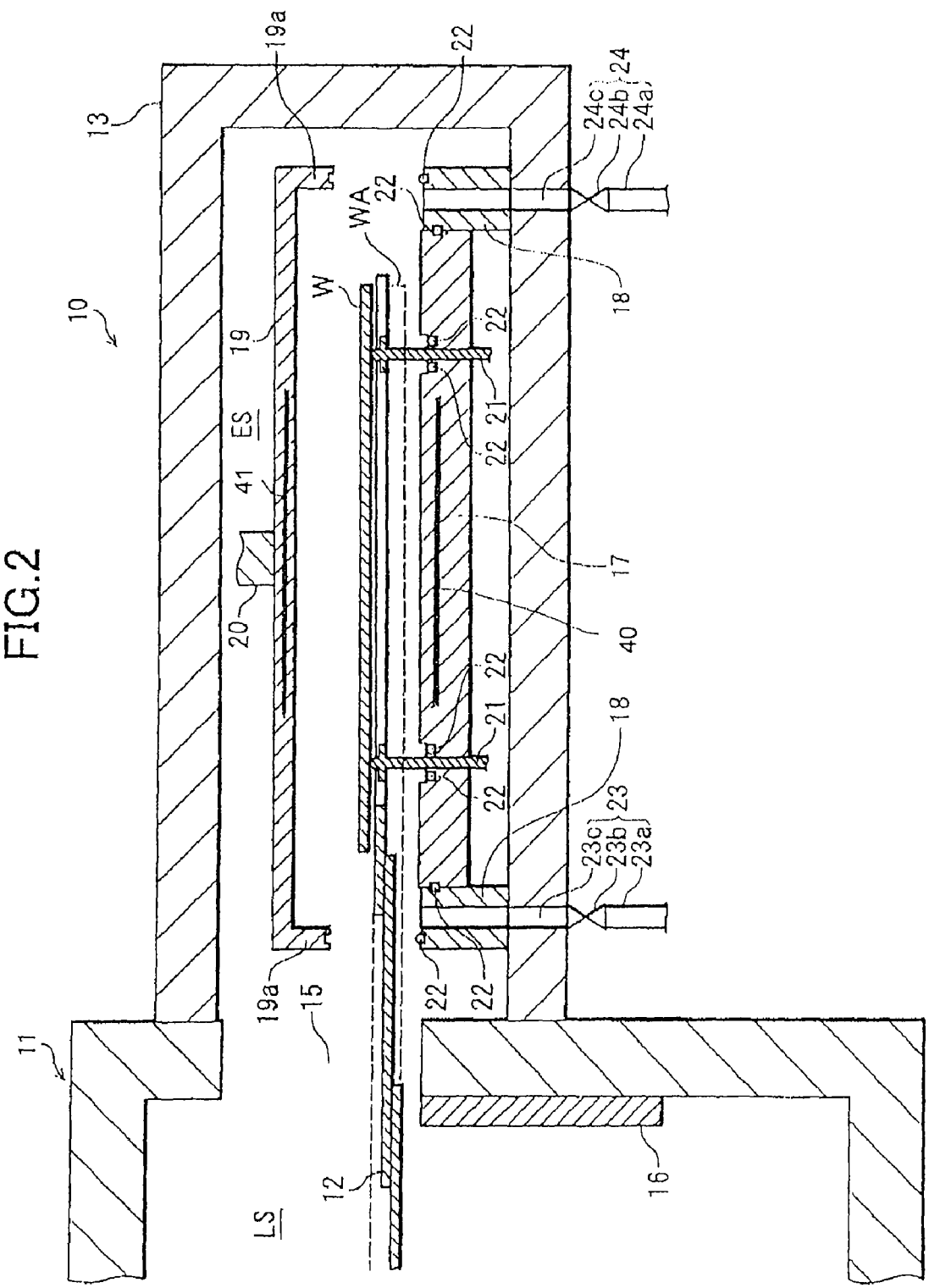
FIG. 2 is a cross-sectional view showing the enclosure in FIG. 1 spaced apart from the enclosure base (stage heater).

As shown in FIG. 2, when the wafer W is transferred in and out by the transfer arm 12 in the substrate processing apparatus 10, the enclosure 19 abutting the enclosure base 18 moves away from the stage heater 17 upwardly in FIG. 2 so as to exit out of a motion range WA (i.e., the bounds defined by the dashed line) of the transfer arm 12. The amount of upward movement of the enclosure 19 is set equal to a distance in which the shaking transfer arm 12 moving between the enclosure 19 and stage heater 17 to transfer the wafer W does not touch the enclosure 19, for example, 35 mm. The immovable stage heater 17 is initially disposed at a position where the shaking transfer arm 12 cannot touch the stage heater 17. In short, in the substrate processing apparatus 10, the transfer arm 12, which transfers the wafer W in and out, does not touch the stage heater 17 and enclosure 19.

To facilitate the delivery and receipt of the wafer W between the transfer arm 12 and stage heater 17, the pusher pins 21 project upwardly from the surface of the stage heater 17. The amount of the projection of the pusher pin 21 is set less than the amount of upward movement of the enclosure 19, which prevents the wafer W from being hidden behind the side wall 19a of the enclosure 19.

According to the substrate processing apparatus of the present embodiment, as described above, the transfer of the wafer W by the transfer arm 12 does not involve contact between the transfer arm 12 and the stage heater 17 or enclosure 19, and therefore there is no need to consider the contact between the transfer arm 12 and the stage heater 17 or enclosure 19 upon defining the space IS by the stage heater 17 and enclosure 19. Accordingly, the need to secure a clearance for the transfer arm 12 and the stage heater 17 or enclosure 19 in the internal chamber 14 is eliminated, thereby reducing the capacity of the space IS. In the present embodiment, the capacity of the space IS when the enclosure 19 abuts the enclosure base 18 is set, for example, at 0.4 L.

In the above substrate processing apparatus 10, the wafer W having the damaged Low-k film is transferred in the space LS in the load lock chamber 11 maintained under vacuum and in the space ES in the external chamber 13 maintained close to a vacuum. Such chambers prevent the damaged Low-k film from absorbing moisture and the production of side reaction products during the restoration process of the Low-k film performed with the silylation gas.

In addition, in the above substrate processing apparatus 10, when the wafer W is transferred in and out by the transfer arm 12, the enclosure 19 moves away from the enclosure base 18 (stage heater 17). With the moving mechanism of the enclosure 19 having a relatively simple structure, the substrate processing apparatus 10 can be structurally simple.

In the above substrate processing apparatus 10, the enclosure 19 and stage heater 17 each contain a heater. These two heaters 40 and 41, which apply heat for enhancing the restoration process of the Low-k film, promptly restore the damaged Low-k film.

Furthermore, in the above substrate processing apparatus 10, the supply-side open/close valve 23b and exhaust-side open/close valve 24b, which are attached to the gas supply pipe 23a and gas exhaust pipe 24a, respectively, in communication with the space IS, are arranged adjacent to the external chamber 13. When thus arranged supply-side open/close valve 23b and exhaust-side open/close valve 24b close the gas supply pipe 23a and gas exhaust pipe 24a, only the gas supply hole 23c and gas exhaust hole 24c communicate with the space IS where the silylation gas is filled. Accordingly, the capacity of parts in communication with the space IS can be reduced, thereby reliably decreasing the usage of the silylation gas during the above-noted restoration process of the Low-k film.

Next, a description will be given of a substrate processing apparatus according to the second embodiment of the present invention.

Figure 3:
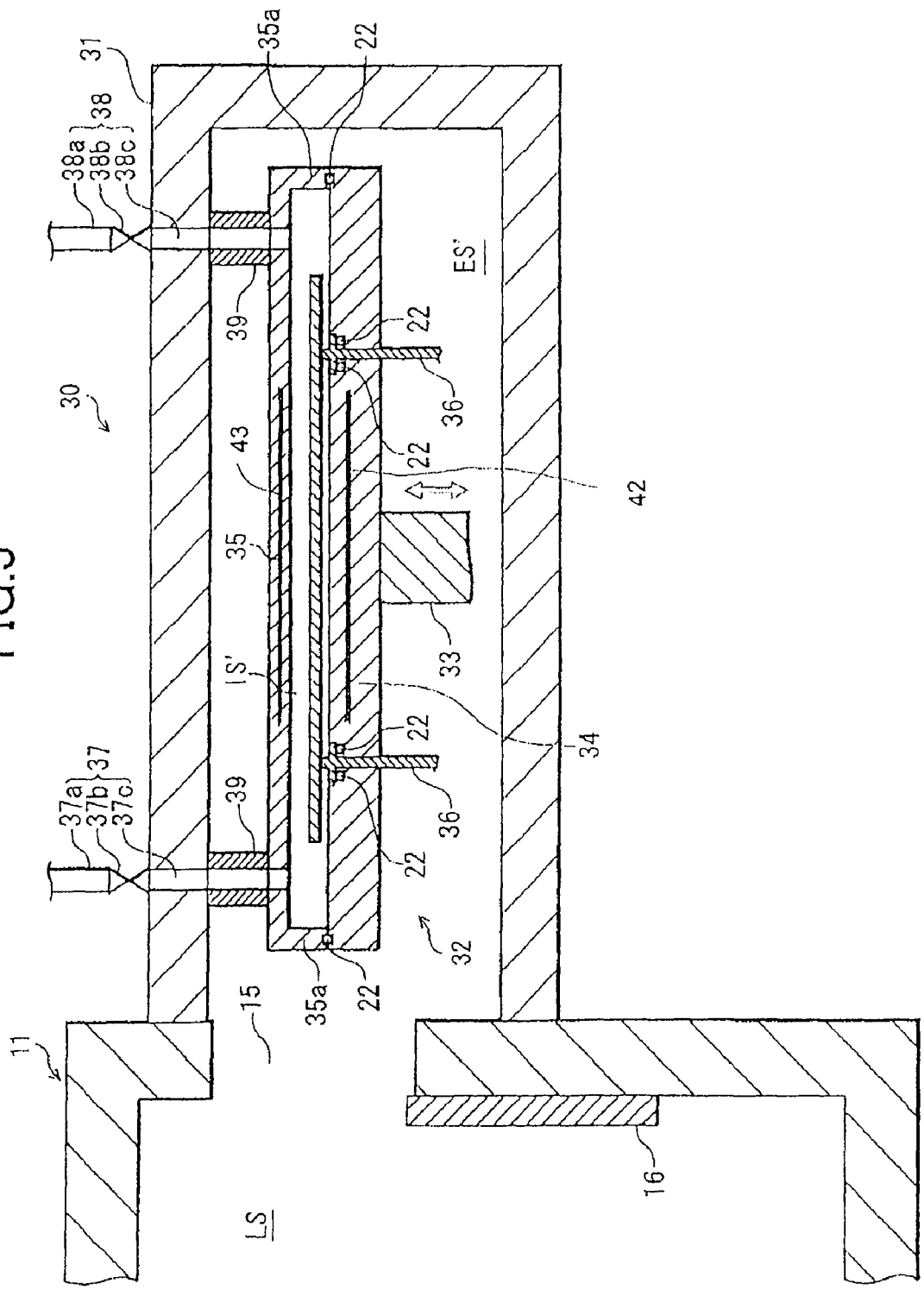
FIG. 3 is a cross-sectional view schematically showing the construction of a substrate processing apparatus according to a second embodiment of the present invention.

FIG. 3 is a cross-sectional view schematically showing the construction of the substrate processing apparatus according to the present embodiment.

In FIG. 3, the substrate processing apparatus 30 is also disposed adjacent to the load lock chamber 11.

The substrate processing apparatus 30 is comprised of a case-like external chamber 31 connected to the load lock chamber 11 and an internal chamber 32 housed in a space ES' in the external chamber 31. The space ES' in the external chamber 31 is maintained close to a vacuum.

The internal chamber 32 includes a stage heater 34 (movable component), which is a disc member supported by a rod 33, containing a heater 42 (heating unit) and functioning as a mounting stage on which a wafer W is mounted, and an enclosure 35 (at least one another component) that is a circular lid-like member and arranged so as to cover the stage heater 34.

The stage heater 34 is connected to a moving mechanism (not shown) through the rod 33 and moves freely along the outlined arrow direction in FIG. 3. In addition, a plurality of pusher pins 36, functionally equivalent to the pusher pins 21, are arranged on the stage heater 34.

The enclosure 35 is suspended by a plurality of rods 39 from the ceiling of the external chamber 31. In addition, the enclosure 35 has a cylindrical-shaped side wall 35a that surrounds the outer edge of the enclosure 35 and juts toward the stage heater 34. The enclosure 35 also contains a heater 43 (heating unit).

When the enclosure 35 abuts the stage heater 34, the stage heater 34 and enclosure 35 define a space IS'. O-rings 22 are arranged between the stage heater 34 and side wall 35a of the enclosure 35 and between the stage heater 34 and pusher pin 36, respectively, to seal the space IS' from the space ES'.

The substrate processing apparatus 30 is comprised of a process-gas supply unit 37 supplying a process gas and nitrogen gas to the space IS' and a process-gas exhaust unit 38 exhausting the process gas in the space IS'.

The process-gas supply unit 37 includes a gas supply pipe 37a installed outside the external chamber 31, a supply-side open/close valve 37b which is attached to the gas supply pipe 37a and opens and closes the gas supply pipe 37a, and a gas supply hole 37c which penetrates a wall of the external chamber 31, rod 39 and enclosure 35 and has an opening facing the stage heater 34. The supply-side open/close valve 37b in the process-gas supply unit 37 is disposed adjacent to the external chamber 31. As the supply-side open/close valve 37b closes the gas supply pipe 37a, only the gas supply hole 37c communicates with the space IS'.

The process-gas exhaust unit 38 includes a gas exhaust pipe 38a installed outside the external chamber 31, an exhaust-side open/close valve 38b which is attached to the gas exhaust pipe 38a and opens and closes the gas exhaust pipe 38a, and a gas exhaust hole 38c which penetrates a wall of the external chamber 31, rod 39 and enclosure 35 and has an opening facing the stage heater 34. The exhaust-side open/close valve 38b in the process-gas exhaust unit 38 is disposed adjacent to the external chamber 31. As the exhaust-side open/close valve 38b closes the gas exhaust pipe 38a, only the gas exhaust hole 38c communicates with the space IS'.

In a state where the stage heater 34 abuts the enclosure 35 and a wafer W having a damaged Low-k film is housed in the space IS', a silylation gas and nitrogen gas are supplied from the process-gas supply unit 37 to the space IS'. After the space IS' is filled with a certain amount of the silylation gas and nitrogen gas, the space IS' is sealed. Simultaneously, the above-mentioned restoration process for the Low-k film is carried out in the space IS'. The heater 43 in the enclosure 35 and the heater 42 in the stage heater 34 apply heat to the wafer W to enhance the restoration process for the Low-k film. After a certain period of sealing, the process-gas exhaust unit 38 discharges the silylation gas and so on in the space IS'.

As shown in FIG. 4, when the wafer W is transferred in and out by the transfer arm 12 in the substrate processing apparatus 30, the stage heater 34 abutting the enclosure 35 moves away from the enclosure 35 downwardly in FIG. 3 so as to exit out of the motion range WA (i.e., the bounds defined by the dashed line in FIG. 3) of the transfer arm 12. The amount of downward movement of the stage heater 34 is set equal to a distance in which even if the transfer arm 12 that moves in between the stage heater 34 and enclosure 35 to transfer the wafer W shakes, the transfer arm 12 does not touch the stage heater 34. The immovable enclosure 35 is initially disposed at a position where the shaking transfer arm 12 cannot touch the enclosure 35. In short, in the substrate processing apparatus 30, the transfer arm 12, which transfers the wafer W in and out, does not touch the stage heater 34 and enclosure 35.

To facilitate the delivery and receipt of the wafer W between the transfer arm 12 and stage heater 34, the pusher pins 36 project upwardly from the surface of the stage heater 34. The amount of the projection of the pusher pin 36 is set less than the amount of downward movement of the enclosure 35, which prevents the wafer W from being hidden behind the side wall 35a of the enclosure 35.

According to the substrate processing apparatus of the present embodiment, as described above, the transfer of the wafer W by the transfer arm 12 does not involve contact between the transfer arm 12 and the stage heater 34 or enclosure 35, and there is therefore no need to secure a clearance for the transfer arm 12 and the stage heater 34 or enclosure 35 in the internal chamber 32, thereby reducing the capacity of the space IS'.

In the substrate processing apparatus 30, when the wafer W is transferred in and out by the transfer arm 12, the stage heater 34 moves away from the enclosure 35. Some side reaction products may adhere to the enclosure 35 during the above-mentioned restoration process of the Low-k film, however, the immovable enclosure 35 can keep the side reaction products thereon, unlike in the case where a movable lid-like member drops reaction products peeled off due to an impact of the movement of the movable lid-like member, thereby preventing the side reaction products as foreign matter from adhering to the wafer W mounted on the stage heater 34.

Although the chemical reaction process in the above-mentioned embodiments is performed to restore the Low-k film with the silylation gas supplied to the space IS (IS') in the internal chamber 14 (32), A feasible chemical reaction process is not limited to this. For example, the chemical reaction process may include a process (HTS process) of removing a SiOBr layer, which is formed by etching a polysilicon layer using plasma of the hydrogen bromide gas, by hydrogen fluoride gas. In this process, since the hydrogen fluoride gas supplied into the space IS (IS') is a corrosive gas, the hydrogen fluoride gas flowing outside of the space IS (IS') may cause defects such as corrosion of the components present outside the space IS (IS'). However, in the substrate processing apparatus 10 (30), the hydrogen fluoride gas is supplied into only the space IS (IS') in the internal chamber 14 (32) housed in the space ES (ES') in the external chamber 13 (31). Even if the hydrogen fluoride gas leaks from the space IS (IS'), the leakage reaches the space ES (ES') but not the outside of the space ES (ES'). Accordingly, the substrate processing apparatus of the present invention can provide safety against the gas leakage.

Although the space LS in the load lock chamber 11 is maintained under vacuum and the space ES (ES') in the external chamber 13(31) is maintained close to a vacuum in the above-mentioned embodiments, the space LS and space ES (ES') can be filled with an inert gas. Even in the case of the inert gas, the damaged Low-k film in the wafer W on the move does not absorb moisture, and consequently the side reaction products are not produced.

In addition, the supply-side open/close valve 23*b* (37*b*) and exhaust-side open/close valve 24*b* (38*b*) can be disposed adjacent to the internal chamber 14 (32).

Although a semiconductor wafer W is used as a substrate in the above-mentioned embodiments, the substrate is not limited to this and can be, for example, a glass substrate for an LCD (Liquid Crystal Display) or FPD (Flat Panel Display).

What is claimed is:

1. A substrate processing apparatus comprising:
an external chamber;
an internal chamber housed in a space in said external chamber;
a gas supply unit adapted to supply a process gas into the space in said internal chamber; and
a gas exhaust unit adapted to exhaust the process gas from the space in said internal chamber,
wherein the space in said external chamber is under a reduced pressure or filled with an inert gas,
wherein said internal chamber includes a lid-like member defining the space in said internal chamber together with both a mounting stage on which said substrate is mounted and an enclosure base, which is a ring member, disposed so as to surround a periphery of the mounting stage, the lid-like member being movable and both the mounting stage and the enclosure base being non-movable, the lid-like member being in contact with the enclosure base so as to seal the space in said internal chamber from the space in said external chamber, the lid-like member having a flat portion that forms an upper surface of the internal chamber and does not make contact with the enclosure base when the space in said internal chamber is sealed and a protruding portion that does make contact with the enclosure base when the space in said internal chamber is sealed,
wherein both said gas supply unit and said gas exhaust unit penetrate the enclosure base,
wherein the process gas is supplied upwardly into the space in said internal chamber and is exhausted downwardly from the space in said internal chamber, and
wherein when said substrate is transferred in and out by a transfer arm used to transfer said substrate, said lid-like member moves away from the enclosure base so as to exit out of a motion range within which said transfer arm can move.

2. The substrate processing apparatus according to claim 1, wherein
said lid-like member and said mounting stage each include a heating unit.

3. The substrate processing apparatus according to claim 1, wherein
said gas supply unit includes a gas supply pipe in communication with the space in said internal chamber, said gas supply pipe has an open/close valve opening and closing said gas supply pipe, and said open/close valve is disposed in the proximity of said internal chamber.

4. The substrate processing apparatus according to claim 1, wherein said protruding portion of said lid-like member is a cylindrical-shaped side wall that surrounds an outer edge of said lid-like member and juts toward said enclosure base, and
wherein when said substrate is transferred in and out, said side wall exits out of the motion range within which said transfer arm can move.

5. The substrate processing apparatus according to claim 3, said open/close valve is disposed such as to be adjacent to and abutting a wall portion of said external chamber.

6. The substrate processing apparatus according to claim 1, wherein said gas supply unit is disposed at an end of the enclosure base and said gas exhaust unit is disposed at another end of the enclosure base positioned opposite to the end of the enclosure base with regard to the mounting stage.

7. The substrate processing apparatus according to claim 1, further comprising a plurality of pin members adapted to project from a surface of said mounting stage and support the substrate from a back surface of the substrate,
where an amount of the projection of the plurality of pin members is set less than an amount of upward movement of the lid-like member.

\* \* \* \* \*